INVENTOR.
Arthur D. Evans
BY
Stevens, Davis, Miller & Mosher
ATTORNEYS

May 26, 1964 A. D. EVANS 3,134,912

MULTIVIBRATOR EMPLOYING FIELD EFFECT DEVICES AS TRANSISTORS AND VOLTAGE VARIABLE RESISTORS IN INTEGRATED SEMICONDUCTIVE STRUCTURE

Filed May 2, 1960 2 Sheets-Sheet 2

INVENTOR
Arthur D. Evans
BY

ATTORNEY

United States Patent Office 3,134,912 Patented May 26, 1964

3,134,912

MULTIVIBRATOR EMPLOYING FIELD EFFECT DEVICES AS TRANSISTORS AND VOLTAGE VARIABLE RESISTORS IN INTEGRATED SEMICONDUCTIVE STRUCTURE

Arthur D. Evans, Farmers Branch, Tex., assignor to Texas Instruments Incorporated, Dallas, Tex., a corporation of Delaware Filed May 2, 1960, Ser. No. 26,343
8 Claims. (Cl. 307—88.5)

This invention relates to a novel multivibrator circuit and to a novel solid-state semiconductor multivibrator circuit.

Various multivibator circuit designs are known which utilize a variety of active circuit elements. Several designs have been proposed utilizing field-effect transistors of the type disclosed in Patent No. 2,744,970 granted to W. Shockley. These designs, however, suffer the drawback that full voltage is not transferred between the channel of one field-effect transistor to the gate of the other during switching. Thus, switching becomes uncertain. Also, these designs are inefficient from a power standpoint.

Accordingly, the present invention provides a novel multivibrator circuit embodying field-effect semiconductor devices in a novel arrangement to overcome the problems stated above. The circuit of the present invention is also designed in such a way that it can be incorporated into a single crystal of semiconductor material and, therefore, the circuit is capable of maximum miniaturization.

These advantages are achieved by the present invention by providing a self-biased bistable multivbrator circuit that has efficient regenerative action by using field-effect transistors as constant current devices to transfer all of the voltage from the drain of one multivibrator transistor to the gate of the other multivibrator transistor, thereby requiring only a single narrow positive voltage pulse to switch the circuit. Further, this invention provides a self-biased bistable multivibrator circuit that operates efficiently as a switch by using field-effect transistors as voltage variable resistors in the load circuit to provide high impedance during operation of one of the multivibrating transistors and low impedance during cut-off of this transistor.

It is an object of the present invention to provide a self-biased bistable multivibrator circuit that has efficient regenerative action by using field-effect transistors.

It is still another object of the present invention to provide a self-biased bistable multivibrator circuit that acts efficiently as a switch by using field-effect transistors.

It is still another object of the present invention to provide a multivibrator circuit that replaces large resistances with field-effect transistors.

It is still another object of the present invention to provide a multivibrator circuit using field-effect transistors as the multivibrating elements that can easily and economically be embodied into a single piece of solid semiconductor material.

It is still a further object of the present invention to provide a multivibrating circuit that can easily and economically be embodied into a single piece of solid semiconductor material by using field-effect transistors in place of large resistances.

These and other objects of the invention will become evident from the following description of a preferred embodiment of the invention when taken with the drawings, in which.

Figure 1:
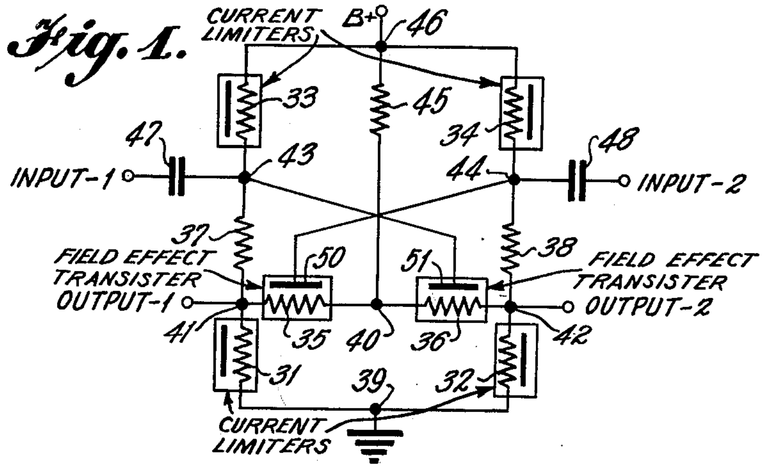
FIGURE 1 is a schematic diagram of the novel multivibrator circuit.

FIGURE 1 shows a novel self-biased bistable multivibrator circuit composed of two field-effect transistors, four field-effect current limiters, three resistors and two capacitors. The current limiters 31, 32, 33 and 34 are of the type disclosed in a patent application by James Ross Macdonald, Serial Number 841,434, filed September 18, 1959, now abandoned and entitled "Constant Current Device." The field-effect transistors 35 and 36 are of the type disclosed in Patent No. 2,744,970, granted to W. Shockley. The circuit has two stable operating phases. Field-effect transistor 36 has its source connected to the source of field-effect transistor 35, and these sources are connected to terminal 40 and one side of resistor 45. The other side of resistor 45 is connected to a positive voltage at terminal 46. The voltage source at terminal 46 supplies the positive bias voltage for both field-effect transistors 35 and 36. Field-effect transistor 36 has its drain connected to current limiter 32 at terminal 42. Current limiter 32 is connected to ground potential 39, and acts as the load for transistor 36. Another current path is provided by connecting one end of resistor 38 to terminal 42 and the other end of resistor 38 to current limiter 34, and this, in turn, is connected to voltage source 46. The other half of the circuit is symmetrical with the portion just described. The significance of using current limiters 31, 32, 33 and 34 in place of resistors will be apparent as the description of the circuit proceeds. Capacitors 47 and 48 serve as input couplers.

For clarification, the operation of the circuit will be described. The description is for the case of field-effect transistors with p-type channels. It should be noted that transistors of n-type channels can also be used. The circircuit has two stable phases, and can be generally formed as a flip-flop circuit similar to the Eccles-Jordan type of vacuum tube flip-flop. To cut field-effect transistor 35 off and to cut transistor 36 on, a positive voltage pulse is applied to terminal 44. The pulse causes an increase in voltage on the gate 50 of transistor 35 thereby pinching off the current. As this occurs, the voltage of drain 41 becomes more negative causing the voltage of terminal 43 to become more negative thereby decreasing the voltage on gate 51 of transistor 36 and allows transistor 36 to operate. In order to keep transistor 35 cut off while transistor 36 is operating, a positive voltage of sufficient value must be maintained on gate 50 of transistor 35 to keep the current pinched off. As transistor 36 conducts, the voltage of drain 42 becomes more positive causing the voltage at terminal 44 to become more positive, thus preventing transistor 35 from operating. In order to provide efficient regenerative action, the constant current device 34 is used in place of a resistor. This device has high resistance, thereby permitting only a constant current to flow through resistor 38. This means that as the voltage at drain 42 becomes more positive, the voltage at point 44 becomes more positive by the same amount. Therefore, as much increase in voltage as possible is present on gate 50 of field-effect transistor 35 allowing the circuit to be regenerative. Transistor 36 will conduct and transistor 35 will remain cut off until a positive voltage pulse is applied to terminal 43, whereby the switching action takes place as previously described.

The circuit may be used as a switching device. In this instance it is desirable to produce the greatest change in voltage at output terminal 42 as possible. This is accomplished by using current limiters 31 and 32 instead of resistors. As field-effect transistor 36 conducts, current limiter 32 acts as a large resistor, thereby causing a large increase in voltage at output terminal 42. As transistor 36 is cut off, the voltage of output terminal 42 approaches ground potential 39. This action allows a high impedance in the current limiter circuit during operation of transistor 36 and a low impedance in the current limiter circuit during the time that transistor 36 is cut off. In this way, the circuit acts as a switch.

Figure 2:
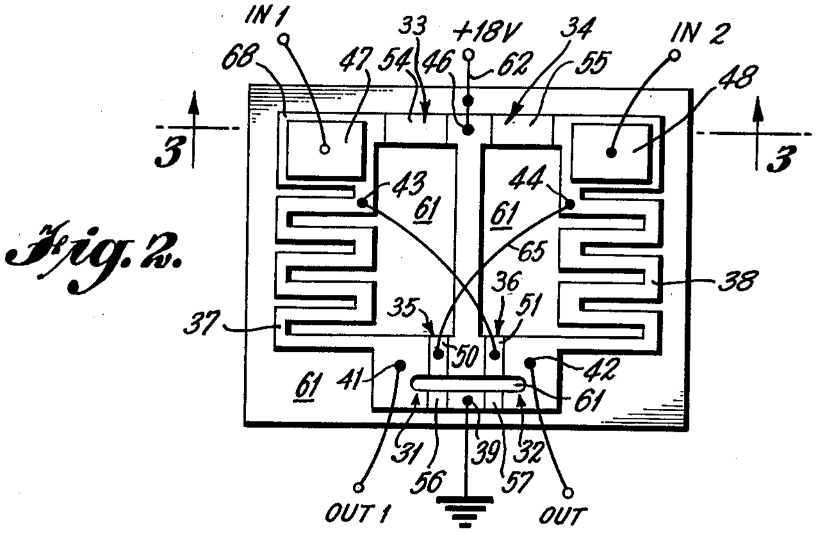
FIGURE 2 is a top plan view of the novel solid state semiconductor network embodying the novel multivibrator circuit of the present invention.
Figure 3:
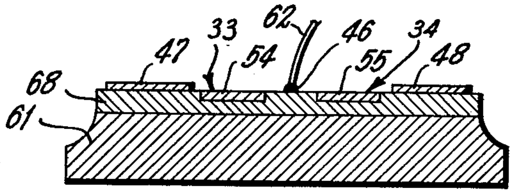
FIGURE 3 is a sectional view taken along lines 3—3 of FIGURE 2.

The circuit in FIGURE 1 can be embodied in a single piece of semiconductor material thereby forming a solid-state semiconductor circuit of small dimensions as shown in FIGURES 2 and 3. The wafer 61, as shown, is single crystal silicon of n-type conductivity, about 7 ohm-cm. A p-type diffused layer 68 is formed in one face of the wafer by a conventional technique. The thickness of layer 68 is about 0.1 mil. As solid-state diffusion techniques are well known in the art and do not relates to the novelty of the present invention, no attempt will be made to elaborate on them in this application.

Referring to FIGURE 2, the solid-state semiconductor circuit consists of input capacitance 47 formed by a metal contact evaporated over a $SiO_2$ layer formed on top of the p-diffusion layer 68. The p-diffusion layer directly beneath capacitor 47 acts as terminal 43. The channel of field-effect current limiter 33 is contiguous to terminal 43 and is directly beneath gate 54 of field-effect current limiter 33. Gate 54 is an n-diffusion into the p-layer, thus defining a channel about 0.02 mil thick. Lead wire 62 for bias voltage is soldered via an ohmic contact directly to the other end of field-effect current limiter 33 at terminal 46. A current path is provided by the p-diffusion layer 68 extending from terminal 46 to terminal 40, and acts as resistor 45 in the circuit as shown in FIGURE 1. Field-effect transistor 35 is contiguous to the end of resistor 45 with gate of transistor 35 designated by numeral 50. The other end of transistor 35 has terminal 41 applied to it. Resistor 37, shown in FIGURE 1, is formed by portion 37 of layer 68 extending from terminal 41 back to terminal 43. It will be noted with reference to FIGURE 2 that the resistance of resistor 37 is increased by establishing a circuitous path. The channel of current limiter 31 is contiguous with the channel of field-effect transistor 35. A suitable ohmic contact 39 is made to the other end of the channel of current limiter 31, and the lead from contact 39 is connected to ground potential. Gate 56 of limited 31 is left floating. A lead wire 65 is connected from gate 50 of transistor 35 to terminal 44, thereby forming the connection for the bias voltage of transistor 35. The region that is generally designated by numeral 61 is etched away through layer 68 to prevent electrical contacting between the various elements of the solid semiconductor circuit. The other half of the solid semiconductor circuit is the same as described above because of the symmetry of the circuit.

Figure 4:
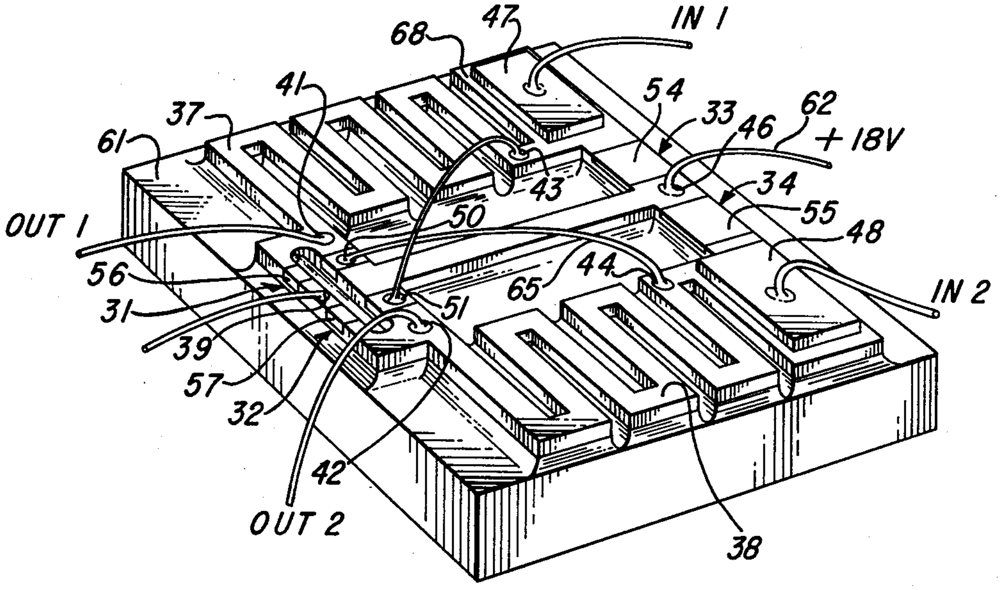
FIGURE 4 is an isometric view of the network shown in FIGURE 2.

FIGURE 3 shows a sectional view of the solid-state semiconductor circuit of FIGURE 2, taken along line 3—3. FIGURE 4 is an isometric view of the network shown in FIGURE 2.

Although the present invention has been shown and described as a specific preferred embodiment, nevertheless, changes will occur to those skilled in the art which do not depart from the inventive concept. Such changes are deemed to come within the purview of the invention.

What is claimed is:

1. In a multivibrator circuit, a first amplifying device having a control electrode and a pair of output electrodes, a second amplifying device having a control electrode and a pair of output electrodes, a first series circuit including the output electrodes of said first amplifying device and first load impedance means along with a voltage source, a second series circuit including the output electrodes of said second amplifying device and second load impedance means along with said voltage source, said first and second load impedance means including current limiter means, first coupling means connecting said first load impedance means to said control electrode of said second amplifying device, and second coupling means connecting said second load impedance means to said control electrode of said first amplifying device, the current limiter means exhibiting high impedance for large impressed voltage and low impedance for small impressed voltage so that when one of the amplifying devices is conductive the voltage drop across its associated load impedance means will be virtually equal to the magnitude of said voltage source while when the amplifying device is non-conductive the voltage drop across the load impedance means will be virtually zero.

2. Apparatus according to claim 1 wherein said first and second coupling means include current limiter means connected to said voltage source.

3. Apparatus according to claim 2 wherein said current limiter means and said amplifying devices are field-effect devices.

4. In a multivibrator circuit, first and second transistors each having a control electrode and a pair of output electrodes, a first field-effect current limiter device connected between an output electrode of said first transistor and a reference potential, a second field-effect current limiter device connected between an output electrode of said second transistor and said reference potential, means coupling the other output electrodes of said first and second transistors to a voltage supply, a third field-effect current limiter device connecting the control electrode of said first transistor to said voltage supply, a fourth field-effect current limiter device connecting the control electrode of said second transistor to said voltage supply, impedance means connecting said first current limiter device to the control electrode of said second transistor, and impedance means connecting said second current limiter device to the control electrode of said first transistor, the current limiter devices exhibiting high impedance for large impressed voltage and low impedance for small impressed voltage.

5. A semiconductor network for use in a multivibrator comprising a body of single crystal semiconductor material, a surface layer of one conductivity type defined in said body, a source portion of said surface layer providing a common source for first and second field-effect transistors, first and second spaced-apart regions of the opposite conductivity type defined in said surface layer adjacent the surface thereof, first and second drain portions for said first and second field-effect transistors being defined in said surface layer and connected to said source portion by thin channel portions of said surface layer underlying said first and second regions, third and fourth spaced-apart regions of said opposite conductivity type defined in said surface layer adjacent the surface thereof, a first terminal portion of said surface layer being connected to said first and second drain portions by thin channel portions of said surface layer underlying said third and fourth regions, fifth and sixth spaced-apart regions of said opposite conductivity type defined in said surface layer adjacent the surface thereof, a second terminal portion of said surface layer positioned between said fifth and sixth regions, said second terminal portion being connected to said first and second drain portions by impedance means including thin channel portions of said surface layer underlying said fifth and sixth regions, and a conductive portion of said surface layer connecting said second terminal portion to said source portion.

6. A semiconductor device comprising a body of single crystal semiconductor material, a first region of one conductivity type defined in said body adjacent the surface thereof, a first terminal portion of said first region providing a common source for first and second field-effect transistors, second and third spaced-apart regions of the opposite conductivity type defined in said first region adjacent the surface thereof, first and second drain portions of said first and second field-effect transistors being defined in said first region and connected to said first terminal portion by their channel portions of said first region underlying said second and third regions, fourth and fifth spaced-apart regions of said opposite conductivity type defined in said first region adjacent the surface thereof, and a second terminal portion of said first region positioned between said fourth and fifth regions and connected to said first and second drain portions by thin channel portions of said first region underlying said fourth and fifth regions.

7. A semiconductor device comprising a body of single crystal semiconductor material, a first region of one conductivity type defined adjacent the surface of said body, said first region including a source portion and a drain portion, a second region of opposite conductivity type defined adjacent the surface of said first region and forming a gate, said source and drain portions being connected by a thin channel portion of said first region underlying said second region, a third region of opposite conductivity type defined adjacent the surface of said first region and spaced from said second region, said drain portion being connected to a terminal portion of said first region by a thin channel underlying said third region, first and second conductive means contacting said source and terminal portions respectively whereby a voltage source may be connected thereto, a major current path being defined in said first region between said first and second conductive means, third conductive means contacting said second region whereby biasing potentials may be applied thereto, and fourth conductive means contacting said drain portion from which an output potential may be derived.

8. A semiconductor integrated circuit comprising a wafer of monocrystalline semiconductor material, a field-effect transistor defined in the wafer adjacent a major face thereof by alternate thin layers of semiconductor material of opposite conductivity-types providing a channel and a gate for said transistor, a field-effect current limiter device defined in the wafer adjacent a major face thereof by alternate thin layers of semiconductor material of opposite conductivity-types providing a channel and a gate for the current limiter device, an elongated resistor region defined in the wafer adjacent said one major face by a thin elongated layer of semiconductor material of conductivity-type opposite that immediately underlying the resistor region, the channel of the transistor being electrically connected in series with the channel of the current limiter device, one end of the resistor region being electrically connected to a point intermediate the channels of the transistor and current limiter device, means including contacts adherent to said one major face for supplying operating bias across the series-connected channels of the transistor and current limiter device and for applying variable bias to the gate of the transistor, the gate of the current limiter device being left floating, and means including said resistor region for coupling potentials on said intermediate point to an amplifying stage in said integrated circuit.

References Cited in the file of this patent

UNITED STATES PATENTS

| | | |
|---|---|---|
| 2,954,484 | Hill et al. | Sept. 27, 1960 |
| 2,968,770 | Sylvan | Jan. 17, 1961 |

OTHER REFERENCES

Transistor Electronics, Lo et al., Prentice-Hall, Inc., copyright 1955, Fig. 12.33, page 467.